United States Patent [19]

Katsumata

[11] Patent Number: 5,563,773
[45] Date of Patent: Oct. 8, 1996

[54] SEMICONDUCTOR MODULE HAVING MULTIPLE INSULATION AND WIRING LAYERS

[75] Inventor: Akio Katsumata, Yokohama, Japan

[73] Assignee: Kabushiki Kaisha Toshiba, Kawasaki, Japan

[21] Appl. No.: 334,104

[22] Filed: Nov. 4, 1994

Related U.S. Application Data

[63] Continuation of Ser. No. 976,258, Nov. 13, 1992, abandoned.

[30] Foreign Application Priority Data

Nov. 15, 1991 [JP] Japan ................................ 3-300142
Mar. 10, 1992 [JP] Japan ................................ 4-051482

[51] Int. Cl.⁶ ........................... H05K 1/18; H05K 7/20; H01L 23/34
[52] U.S. Cl. .................. 361/764; 174/252; 174/35 R; 257/700; 257/713; 257/723; 361/717; 361/718; 361/719; 361/720; 361/761; 361/762; 361/783; 361/792; 361/794; 361/795
[58] Field of Search ................... 174/252, 35 R, 174/260, 262, 263; 228/180.21, 180.22; 257/668, 690, 692, 693, 698, 723, 724, 735, 659, 728, 779, 700, 784, 713, 778; 361/704, 707, 712, 717, 714, 718, 719, 720, 721, 722, 723, 752–795, 796, 799, 800, 803, 807, 809, 816, 818; 437/209; 439/68, 63

[56] References Cited

U.S. PATENT DOCUMENTS

| | | | |
|---|---|---|---|
| 3,649,950 | 3/1972 | Gluntz | 439/70 |
| 4,809,058 | 2/1989 | Funamoto et al. | 257/714 |
| 4,973,799 | 11/1990 | Soma et al. | 174/260 |
| 5,241,456 | 8/1993 | Marcinkiewicz et al. | 361/792 |
| 5,258,649 | 11/1993 | Tanaka et al. | 257/787 |
| 5,285,352 | 2/1994 | Pastore et al. | 257/712 |
| 5,371,653 | 12/1994 | Kametani et al. | 361/721 |

FOREIGN PATENT DOCUMENTS

| | | | |
|---|---|---|---|
| 0052738 | 6/1982 | European Pat. Off. | 361/707 |
| 0112760 | 7/1984 | European Pat. Off. | 257/787 |
| 53-53446 | 4/1980 | Japan | 257/692 |
| 57-211259 | 12/1982 | Japan | 257/796 |
| 59-213149 | 12/1984 | Japan | 257/787 |
| 62-155525 | 7/1987 | Japan | 257/712 |
| 63-52461 | 3/1988 | Japan | 257/668 |
| 63-100756 | 5/1988 | Japan | 257/712 |
| 1-30297 | 2/1989 | Japan | 361/818 |
| 1-303745 | 12/1989 | Japan | 257/712 |
| 2-249290 | 10/1990 | Japan | 439/607 |
| 3-188698 | 8/1991 | Japan | 361/719 |
| 3-214763 | 9/1991 | Japan | 257/796 |
| 4-58549 | 2/1992 | Japan | 257/712 |
| 4-287348 | 10/1992 | Japan | 257/712 |

OTHER PUBLICATIONS

IBM Technical Disclosure Bulletin "Plane Electrical Enhancement" vol. 32 No. 10A Mar. 1990.

*Primary Examiner*—Donald A. Sparks
*Attorney, Agent, or Firm*—Finnegan, Henderson, Farabow, Garrett & Dunner, L.L.P.

[57] ABSTRACT

A memory IC having an SOJ type package is mounted on a metal wiring layer on the surface of the outer layer of a multilevel interconnection board. Protecting portions are formed on the package of the memory IC. The protecting portions contact the surface of the metal wiring layer when the memory IC is mounted on the multilevel level interconnection board. The shape of the projecting portions can be of various types, e.g., circular cylinders or prisms. Heat generated within the memory IC is transmitted to the metal wiring layer through the projecting portions. A first insulating layer has first and second surfaces. Wiring layers are formed on each of the first and second surfaces of the first insulating layer, and first and second semiconductor chips are connected to those wiring layers. First and second resin layers cover the whole surface of the outermost wiring layers and the first and second semiconductor chips.

5 Claims, 6 Drawing Sheets

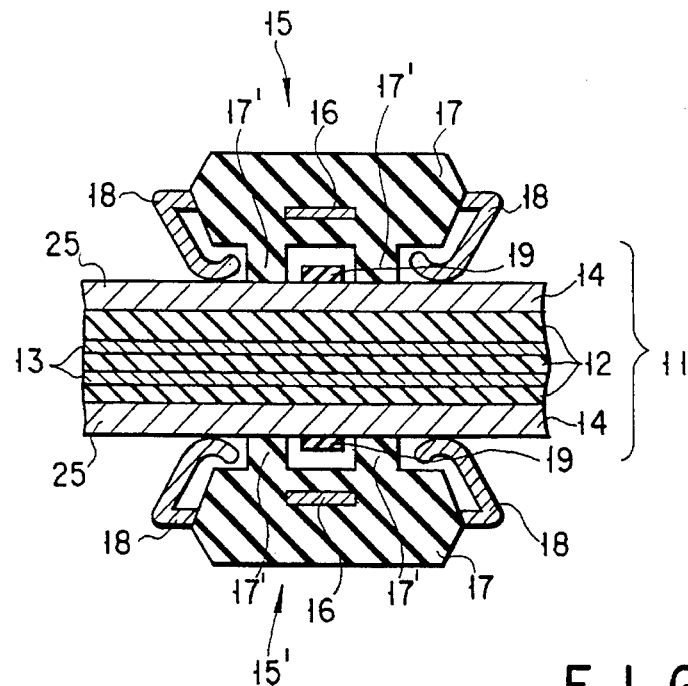
F I G. 2
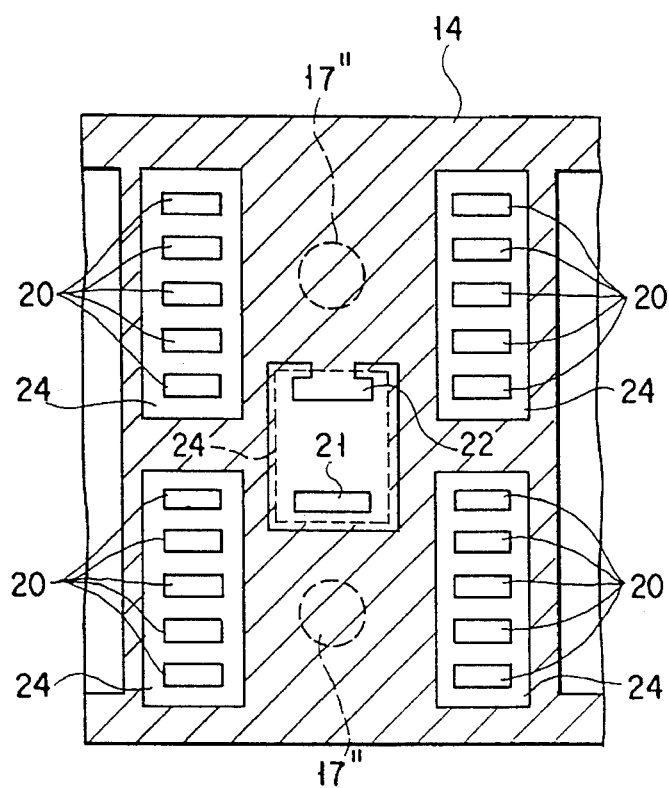
F I G. 3

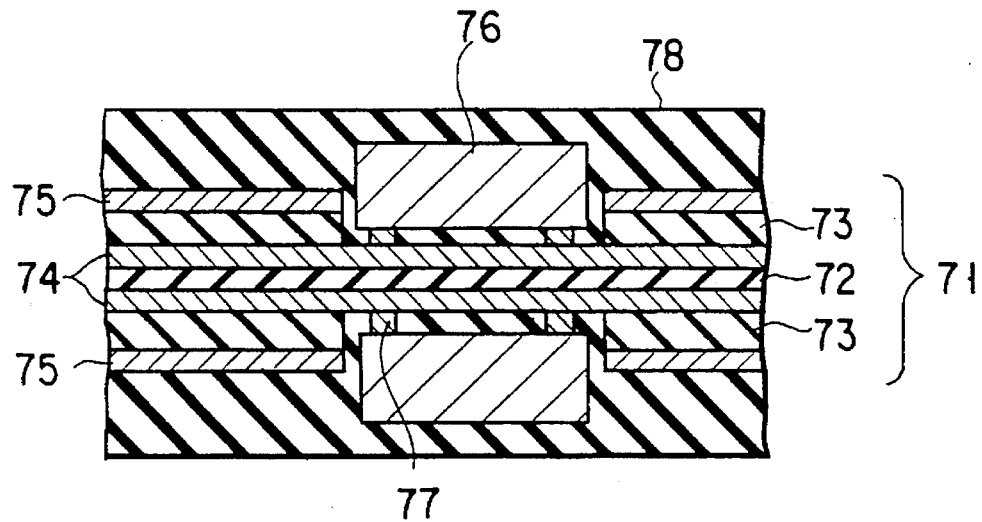
F I G. 8
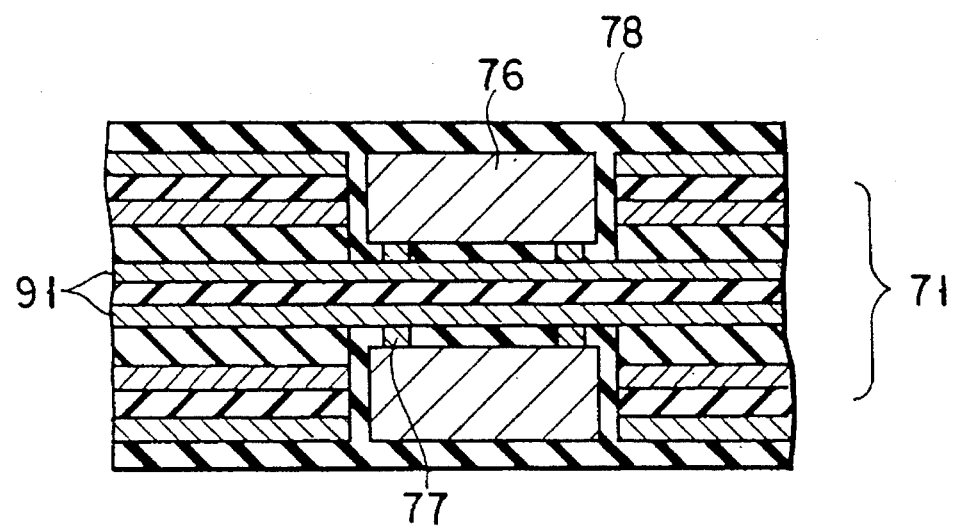
F I G. 9

5,563,773

SEMICONDUCTOR MODULE HAVING MULTIPLE INSULATION AND WIRING LAYERS

This application is a continuation of application Ser. No. 07/976,258 filed Nov. 13, 1992, now abandoned.

BACKGROUND OF THE INVENTION

1. Field of the Invention

The present invention relates to a means of a semiconductor module obtained by mounting a semiconductor element, e.g., a memory integrated circuit on a multilevel interconnection board, which achieves high heat dissipation of the semiconductor element.

2. Description of the Related Art

A memory module is an example of a semiconductor module in which a plurality of memory ICs are mounted on one multilevel interconnection board.

FIG. 1 shows a portion of a conventional memory module on which memory ICs are mounted. Referring to FIG. 1, reference numeral 81 denotes a multilevel interconnection board; 82, insulating layers of the multilevel interconnection board 81; 83, inner wiring layers of the multilevel interconnection board 81; 84, metal wiring layers (e.g., copper foils) on the surfaces of the outer layers of the multilevel interconnection board 81; 85, memory ICs mounted on the device mounting surfaces (e.g., upper and lower surfaces) of the multilevel interconnection board 81; 86, chips of the memory ICs; 87, molding resin packages of the memory ICs; 88, external leads of the memory ICs; and 89, electronic components (e.g., chip capacitors) other than memory ICs that are mounted on the device mounting surfaces of the multilevel interconnection board 81.

The inner wiring layers 83 supply a power supply potential Vcc or a ground potential Vss, and the metal wiring layers 84 transmit a signal. This structure facilities the design of signal wiring lines and the like of the multilevel interconnection board 81. Each inner wiring layer 83 has the same thickness (e.g., about 40 μ) as that of each metal wiring layer 84.

The external leads 88 of each memory IC are soldered to foot wiring portions connected to the corresponding memory IC. The leads of electronic components other than the memory ICs are soldered to the foot wiring portions on the device mounting surfaces to be connected to chip capacitors.

In the memory module described above, heat generation by the chips 86 of the memory ICs 85 gradually increases as the operation speeds of the corresponding memory ICs 85 are increased. Although each memory IC 85 contacts the metal wiring layer 84 on the surface of the outer layer of the multilevel interconnection board 81, a corresponding package 87 does not contact the metal wiring layer 84 on the surface of the outer layer of the multilevel interconnection board 81. Hence, the heat dissipation paths of each memory IC theoretically include a first path extending from the chip 86 through the package 87 to dissipate heat in air, and a second path extending from the chip 86 to dissipate heat in air through the external leads 88 and the metal wiring layer 84.

However, it is known that the second path described above is almost completely ineffective. This is because each metal wiring layer 84 is a copper foil having a thickness of about 40 μm, and a resist (not shown) is usually covered on the surface of the metal wiring layer 84. Accordingly, in the conventional memory module, the heat dissipation path from the chip 86 of each memory IC 85 depends on only the first path extending from the chip 86 to dissipate heat through the package 87. Therefore, heat dissipation in the conventional memory IC 85 is not sufficient.

SUMMARY OF THE INVENTION

The present invention has been made to solve the drawback described above, and has as its object to provide a semiconductor module capable of efficiently dissipating heat even when the amount of heat generated by the chip of a semiconductor device mounted on a multilevel interconnection board is increased.

In order to achieve the above object, a semiconductor module according to the present invention comprises a first insulating layer having first and second surfaces, a first wiring layer on the first surface of the first insulating layer, a first semiconductor chip connected to the first wiring layer, a second insulating layer on the first wiring layer excluding an area on which the first semiconductor chip is mounted, a second wiring layer on the second insulating layer, a first resin layer covering a whole surface of the second wiring layer and the first semiconductor chip, a third wiring layer on the second surface of the first insulating layer, a second semiconductor chip connected to the third wiring layer, a third insulating layer on the third wiring layer excluding an area on which the second semiconductor chip is mounted, a fourth wiring layer on the third insulating layer, and a second resin layer covering a whole surface of the fourth wiring layer and the second semiconductor chip. A semiconductor module according to the present invention may also comprises a board; a metal layer formed on a substantially entire area of at least one of two surfaces of the board; and a semiconductor device mounted on at least one of the two surfaces of the board and having a package having a projecting portion formed on a surface thereof opposing the board to be connected to the metal layer.

Another semiconductor module according to the present invention comprises: a board; a metal layer formed on a substantially entire area of at least one of two surfaces of the board; connection pads formed on the metal layer; a semiconductor chip having electrodes; bumps for connecting the connection pads and the electrodes; and a resin layer covering the metal layer and the semiconductor chip.

Still another semiconductor module according to the present invention comprises: a multilevel interconnection board constituted by stacking an inner wiring layer formed on at least one of two surfaces of one insulating layer and an outer wiring layer formed on the inner wiring layer through the insulating layer excluding a semiconductor chip mounting area thereof; connection pads formed on the inner wiring layer within the semiconductor chip mounting area; a semiconductor chip having electrodes; bumps for connecting the connection pads and the electrodes; and a resin layer covering the outer wiring layer and the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a sectional view partially showing a semiconductor module according to the first embodiment of the present invention;

FIG. 3 is a plan view partially showing a multilevel interconnection board in FIG. 2;

FIG. 8 is a sectional view partially showing a memory module as a semiconductor module according to the second embodiment of the present invention; and FIGS. 9 to 11 are sectional views showing modifications of the memory module of FIG. 8.

DETAILED DESCRIPTION OF THE PREFERRED EMBODIMENTS

Figure 1:
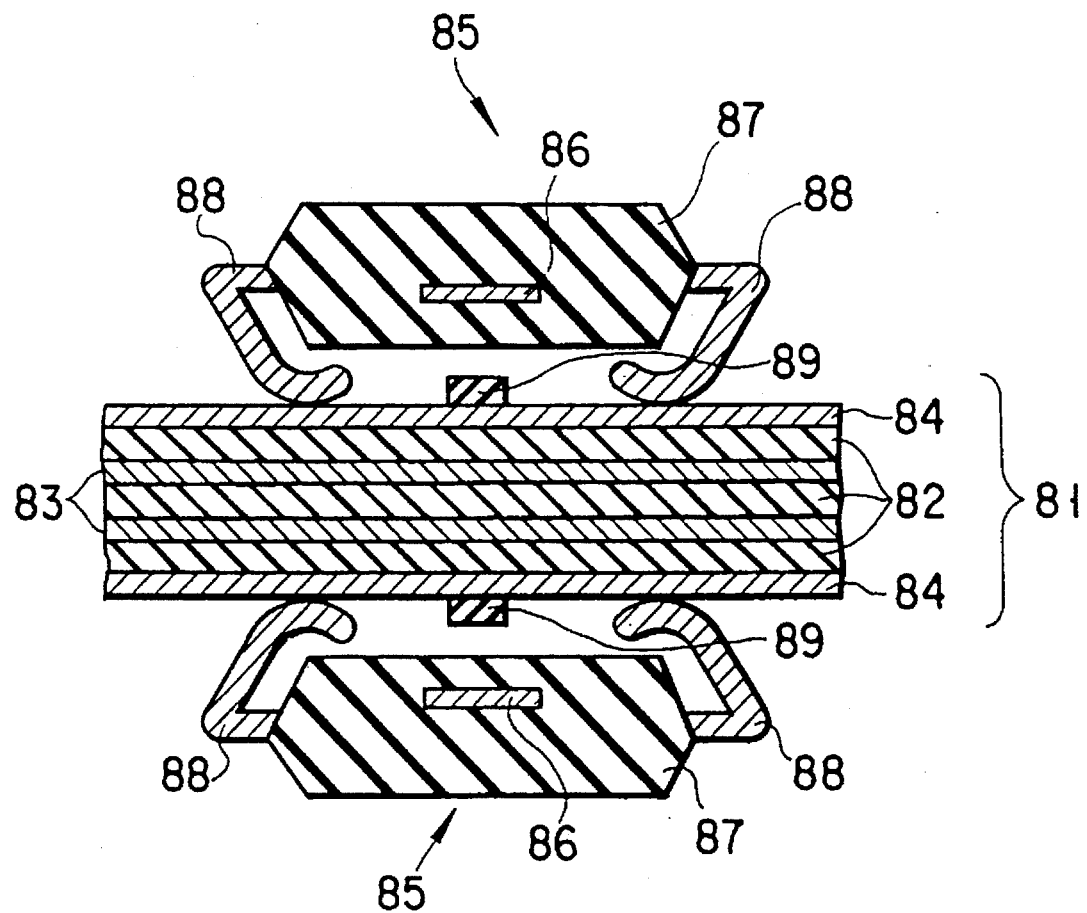
FIG. 1 is a sectional view partially showing a conventional memory module.

The preferred embodiments of the present invention will be described with reference to the accompanying drawings.

FIG. 2 shows a portion of a memory module as a semiconductor module according to the first embodiment of the present invention on which memory ICs are mounted. FIG. 3 shows part of the multilevel interconnection board of FIG. 2.

Referring to FIGS. 2 and 3, reference numeral 11 denotes a multilevel interconnection board; 12, insulating layers (e.g., epoxy resin-based prepreg layers) of the multilevel interconnection board 11; 13, inner wiring layers of the multilevel interconnection board 11; 14, metal wiring layers formed on the surfaces of the outer layers of the multilevel interconnection board 11; 15, memory ICs mounted on the device mounting surfaces (e.g., upper and lower surfaces) of the multilevel interconnection board 11; 16, chips of the memory ICs; 17, packages of the memory ICs; 18, external leads of the memory ICs; 19, electronic components (e.g., chip capacitors) other than memory ICs mounted on the device mounting surfaces of the multilevel interconnection board 11; 20, foot wiring portions for the memory ICs formed on the surfaces of the outer layers of the board 11; and 21 and 22, vcc- and Vss-potential foot wiring portions, respectively, for the chip capacitors formed on the surfaces of the outer layers of the board 11.

The inner wiring layers 13 are for signal transmission, and the metal wiring layers 14 supply the power supply potential Vcc or ground potential Vss. The metal wiring layers 14 for supplying the power (Vcc or Vss) are formed on almost the entire surfaces of the outer layers of the multilevel interconnection board 11 excluding the areas formed on the device mounting surfaces of the outer layers of the board 11 on which the chip capacitors are mounted, and wiring areas having specific applications other than power supply.

The memory ICs 15 have, e.g., SOJ (Small Outline J-lead) type packages. The packages 17 are constituted by a molding resin. The external leads 18 of the memory ICs 15 are soldered to the foot wiring portions 20 for the corresponding memory ICs 15. The leads of the chip capacitors 19 are soldered to the Vcc- and Vss-side foot wiring portions for the corresponding chip capacitors.

A resist is coated on the foot wiring portions 20 for the memory ICs 15 and the foot wiring portions 21 and 22 for the chip capacitors. Reference numeral 24 denote resist coating areas on which the resist is coated. The resist is coated in this manner in order to prevent a solder bridge during parts mounting.

The metal wiring layers 14 to supply power are constituted by, e.g., copper foils, and are formed to be thicker than the inner wiring layers 13. If heat dissipation from the memory ICs 15 is increased, the thicknesses of the metal wiring layers 14 can be unlimitedly increased. However, considering etching of the metal wiring layers 14, the range of the thicknesses of the metal wiring layers 14 may appropriately be 70 μm to 210 μm. Rust preventive coating layers 25 are formed on the surfaces of the metal wiring layers 14 to prevent metal corrosion and to ensure high heat dissipation.

Each package 17 has columnar projecting portions 17' at portions (e.g., two locations) on its lower surface (the surface facing the multilevel interconnection board 11). When memory ICs 15 are mounted on the device mounting surfaces of the multilevel interconnection board 11, the projecting portions 17' contact the metal wiring layers 14 on the surfaces of the outer layers of the multilevel interconnection board 11. Reference numerals 17" denote contact portions between the projecting portions 17' and the metal wiring layers 14.

Figure 4:
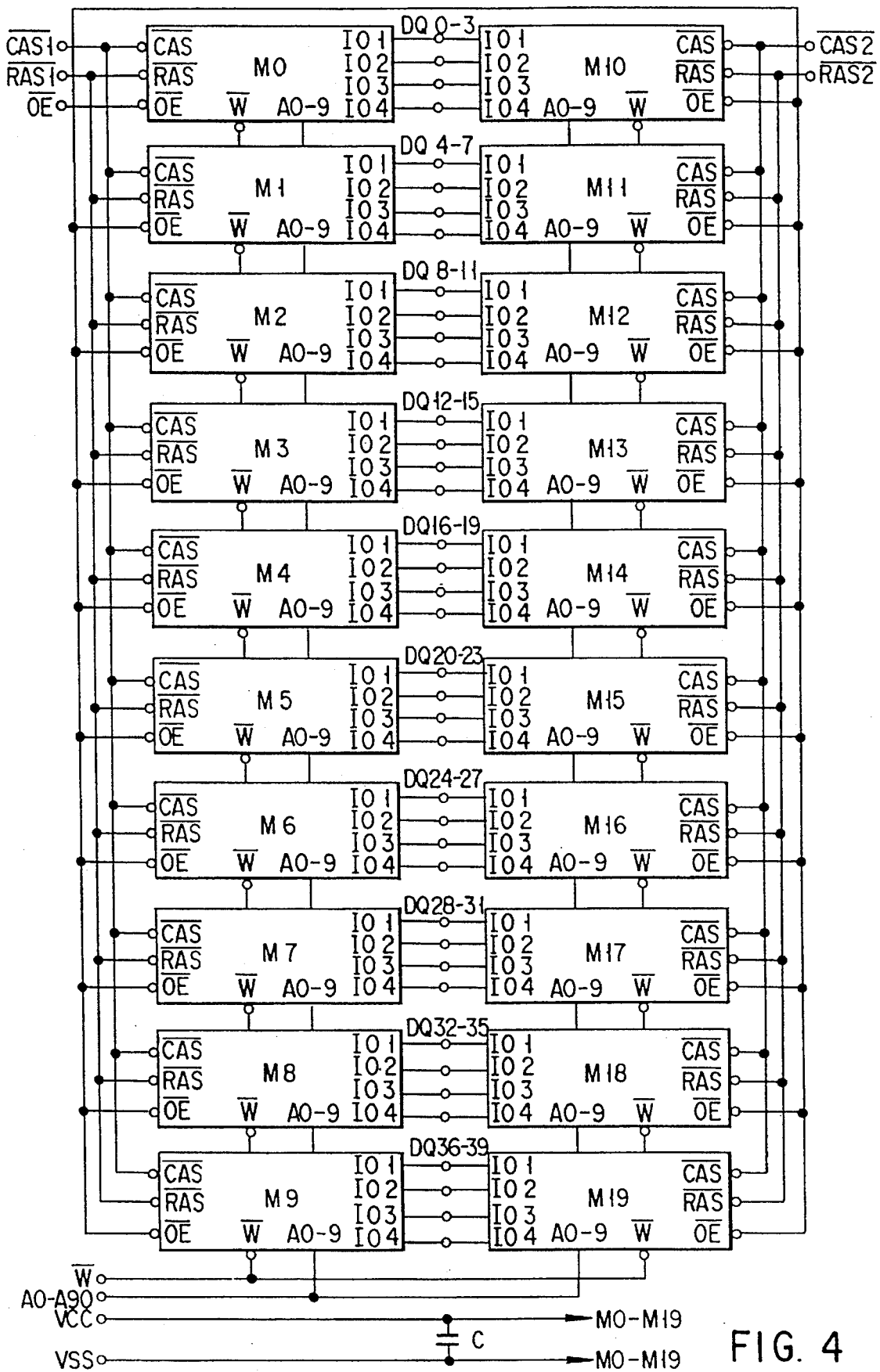
FIG. 4 is a block diagram showing an example of circuit connection of the memory module of FIG. 2.

FIG. 4 shows a circuit connection layout of the memory module shown in FIG. 2. Referring to FIG. 4, the memory ICs are 4-bit I/O type DRAMs (Dynamic Random Access Memories) M0 to M19. Reference symbol C denotes a decoupling capacitor connected between the wiring of the power supply Vcc and the wiring of the ground potential Vss.

The power supply Vcc and ground potential Vss, address signals A0 to A9, a write enable signal $\overline{W}$, and an output enable signal $\overline{OE}$ are supplied to each of the DRAMs M0 to M19. A first row address strobe signal $\overline{RAS1}$ and a first column address strobe signal $\overline{CAS1}$ are supplied to the DRAMs M0 to M9. A second row address strobe signal $\overline{RAS2}$ and a second column address strobe signal $\overline{CAS2}$ are supplied to the DRAMs M10 to M19. The DRAMs M0 to M19 constitute a 2-RAS input, 2-CAS input, 40-bit I/O type memory system as a whole.

Figure 5:
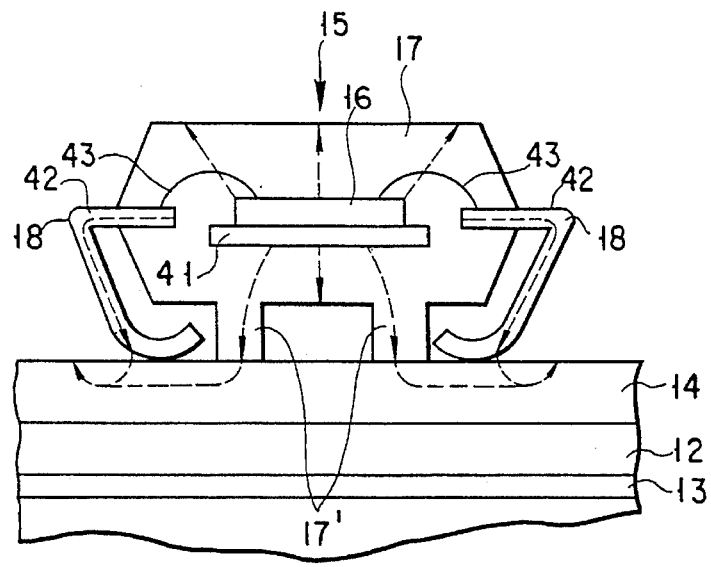
FIG. 5 shows one memory IC mounting portion of FIG. 2 to schematically show paths of heat dissipation from a chip.

FIG. 5 shows one memory IC mounting portion of FIG. 2 to schematically show paths of heat dissipation from the chip. Referring to FIG. 5, the same portions as in FIG. 2 are denoted by the same reference numerals. Reference numeral 41 denotes a bed portion of the memory IC; 42, internal lead portions; and 43, bonding wires.

In the memory module of the embodiment described above, the external leads 18 of the memory IC 15 contact the foot wiring portions 20 of the surface of the outer layer of the board 11, and the package 17 contacts the metal wiring layer 14 of the surface of the outer layer of the board 11 through the projecting portions 17'. Thus, there are three heat dissipation paths for each memory IC 15, as indicated by broken lines in FIG. 5.

According to the first heat dissipation path, heat from the chip 16 is transmitted through the package 17 to dissipate in the air. According to the second heat dissipation path, heat from the chip 16 is transmitted through the internal lead portions 42, the external leads 18, and the metal wiring layer 14 on the surface of the outer layer of the board 11 to dissipate in the air. According to the third heat dissipation path, heat from the chip 16 is transmitted through the projecting portions 17' of the package 17 and the metal wiring layer 14 on the surface of the outer layer of the board 11 to dissipate in the air.

According to the second and third heat dissipation paths, heat generated by the chip 16 is transmitted not through the inner wiring layer 13 for signal transmission but through the metal wiring layer 14 for supplying the power supplies Vcc and Vss and dissipates in the air. Therefore, heat dissipation of the memory IC 15 can be increased when compared to that in the conventional memory module. This is because the metal wiring layer 14 can be formed thicker than the inner wiring layer 13 and thus has a larger heat conductivity than that of the inner wiring layer 13.

Hence, even when the amount of heat generated by the chip 16 is further increased along with the increase in operation speed of the memory IC 15, heat dissipation can be sufficiently efficiently performed (almost three times that of conventional heat dissipation) by the three heat dissipation paths described above.

The first embodiment can be variously modified as will be described below. For example, metal wiring layers for signal transmission may be formed on the surfaces of the outer layers of the board, and wiring layers for the power supply and ground potential may be formed in the inner layers of the board. Even in this case, heat dissipation can be sufficiently efficiently performed when compared to conventional heat dissipation because of the three heat dissipation paths described above.

On the device mounting surfaces as the surfaces of the outer layers of the board, metal layers may be formed on substantially the entire portions excluding their portions for specific applications, and projecting portions 17' of the packages 17 may be brought into contact with these metal layers to perform heat dissipation.

Figure 6A:
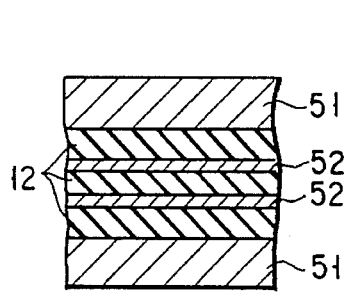
FIGS. 6A and 6B are sectional views showing modifications of the multilevel interconnection board of FIG. 2.

FIG. 6A shows a case wherein solid metal layers 51 are formed on the entire portions of the device mounting surfaces of the surfaces of the outer layers of the board, and wiring layers 52 for the power supply Vcc and the ground potential Vss are formed in the inner layers of the board. Referring to FIG. 6A, reference numerals 12 denote board insulating layers 12.

Figure 6B:
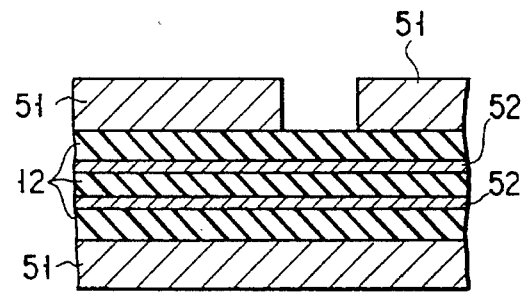

FIG. 6B shows a case wherein solid metal layers 51 are formed on the entire portions of the device mounting surfaces as the surfaces of the outer layers of the board excluding portions for specific applications, and wiring layers 52 for the power supply Vcc and the ground potential Vss are formed in the inner layers of the board. Referring to FIG. 6B, reference numerals 12 denote board insulating layers 12.

Figure 7A:
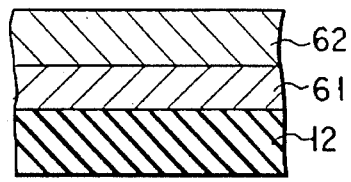
FIGS. 7A and 7B are sectional views showing modifications of the metal layer on the surface of the outer layer of the multilevel interconnection board of FIG. 2.
Figure 7B:
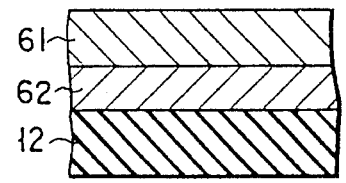

The metal layers 51 (or metal wiring layers) on the surfaces of the outer layers of the board are not limited to copper foils, and can be constituted by forming on a copper foil 61 another metal foil, e.g., an aluminum foil 62, as shown in FIG. 7A. Alternatively, a copper foil 61 may be formed on a metal foil, e.g., an aluminum foil 62, as shown in FIG. 7B. In this case, an insulating layer (not shown) may be intervened between the upper and lower metal foils 61 and 62.

The metal layers 51 (or metal wiring layers) need not be formed on the surfaces of the two outer layers of the board, and a metal layer (or metal wiring layer) can be formed on only the surface of one layer of the board. The insulating layers 12 of the multilevel interconnection board are not limited to epoxy resin-based prepreg layers, but can use a material containing a glass-reinforced board are not limited to epoxy resin-based prepreg layers, but can use a material containing a glass-reinforced epoxy resin or a polyimide-based insulating material.

The shape and number of the projecting portions 17' of the packages 17 can be arbitrarily selected as long as they contact the metal layers of the surfaces of the outer layers of the board. The package of the semiconductor device is not limited to the SOJ type but can be the PLCC (Plastic Leaded Chip Carrier), SOP (Small Outline Package), TSOP (Thin Small Outline Package), or QFP (Quad Flat Package) type.

FIG. 8 shows a semiconductor module according to the second embodiment of the present invention. In this embodiment, the semiconductor module of the present invention is applied to a memory module, and the packing density can be increased in addition to heat dissipation.

Referring to FIG. 8, reference numeral 71 denotes a multilevel interconnection board having four wiring layers; 72 and 73, insulating layers of the multilevel interconnection board 71; 74, inner wiring layers of the multilevel interconnection board 71; 75, outer metal wiring layers formed on the surfaces of the outer layers of the multilevel interconnection board 71; 76, semiconductor chips in which memory integrated circuits are formed; and 78, molding resin layers.

The inner wiring layers 74 are formed on two surfaces of the insulating layer 72, and each outer metal wiring layer 75 is formed on one surface of the corresponding insulating layer 73. The insulating layers 73 and the outer metal wiring layers 75 are not formed in the mounting areas of the semiconductor chips 76. The inner wiring layers 74 supply the power supply potential Vcc and the ground potential Vss, and the outer metal wiring layers 75 are for signal transmission.

The electrodes on each semiconductor chip 76 are electrically connected to the connection pads of the corresponding inner wiring layer 74 through bumps 77. More specifically, the bumps 77 constituted by an Au or Pb/Sn solder are formed on either the electrodes on the semiconductor chip 76 or the connection pads of the corresponding inner wiring layer 74, and the connection pads and the electrodes are bonded under pressure to cause reflow. The molding resin layer 78 covers the entire surface of the insulating layer 73 on which the outer metal wiring layer 75 is formed, and the semiconductor chip 76.

There are two heat dissipation paths along which heat generated by each semiconductor chip of the semiconductor module of the second embodiment dissipates.

According to the first heat dissipation path, heat of the semiconductor chip 76 is transmitted through the molding resin layer 78 to dissipate in air. According to the second heat dissipation path, heat of the semiconductor chip 76 is transmitted through the bumps 77, inner wiring layer 74, the insulating layer 73, and the resin layer 78 to dissipate in the air.

Since the molding resin layer 78 serving as the first heat dissipation path has a high heat resistance, it does not transmit heat to a remote place from the semiconductor chip 76, and heat is mainly dissipated in the air in the vicinity of the chip 76. In contrast to this, in the second heat dissipation path, since the bumps 77 and the inner wiring layer 74 have a low heat resistance, heat is transmitted to a remote place from the semiconductor chip 76. Thus, heat generated by the semiconductor chip 76 is transmitted to the insulating layer 73 and the molding resin layer 78 remote from the semiconductor chip 76 through the inner wiring layer 74, and is dissipated in the air. Accordingly, the first and second heat dissipation paths complement each other. Since a portion, e.g., an outer lead, that narrows each heat dissipation path does not exist, heat dissipation is efficiently performed.

A memory card using the memory module has a standardized outer size, and the standard thickness of the card is as small as 3.3 mm. Hence, with such a memory card, it is difficult to increase the memory capacity. Considering the thickness of the cover plate of the memory card, the memory module that can be housed in the memory card is limited to one having a thickness of 2.8 mm or less.

Conventionally, a memory module to be used in a memory card is obtained by mounting TSOP type memory ICs thinner than SOJ type memory ICs on the two surfaces of a multilevel interconnection board. In this case, assuming that the thickness of the multilevel interconnection board is 0.4 mm and that the thickness of each TSOP type memory IC is 1.2 mm, the total thickness of the memory module is 0.4+2×1.2=2.8 mm<3.3 mm. Thus, even when the thickness of the multilevel interconnection board is decreased, the memory card can house only one memory module. Because of the limitations on the size of the memory card, a maximum of eight TSOPs can be mounted on one surface of the multilevel interconnection board. Hence, a maximum of sixteen TSOPs can be mounted in the memory module. As a result, if the semiconductor chips housed in the memory ICs are 4-Mbit DRAMs, the capacity of one memory card is 8 Mbytes.

In contrast to this, in the memory module shown in FIG. 8, the thickness of the insulating layer 72 is 50 μm and the thickness of each inner wiring layer 74 is 18 μm. The height of the upper surface of the semiconductor chip 76 measured from the surface of the corresponding inner wiring layer 74 is 300 μm, and the thickness of the molding resin layer 78 on each semiconductor chip 76 is 100 μm. Accordingly, the total thickness of the memory module is 886 μm (about 0.9 mm). Therefore, from 3×0.9 mm=2.7 mm<3.3 mm, one memory card can house three multilevel interconnection boards.

Therefore, when one multilevel interconnection board is set to have the same memory capacity as that of the TSOP type memory module, that is, when the semiconductor chip housed in each memory IC is a 4-Mbit DRAM, the capacity of the memory card is 24 Mbytes, which is three times that (8 Mbytes) of the conventional memory card.

Figure 10:
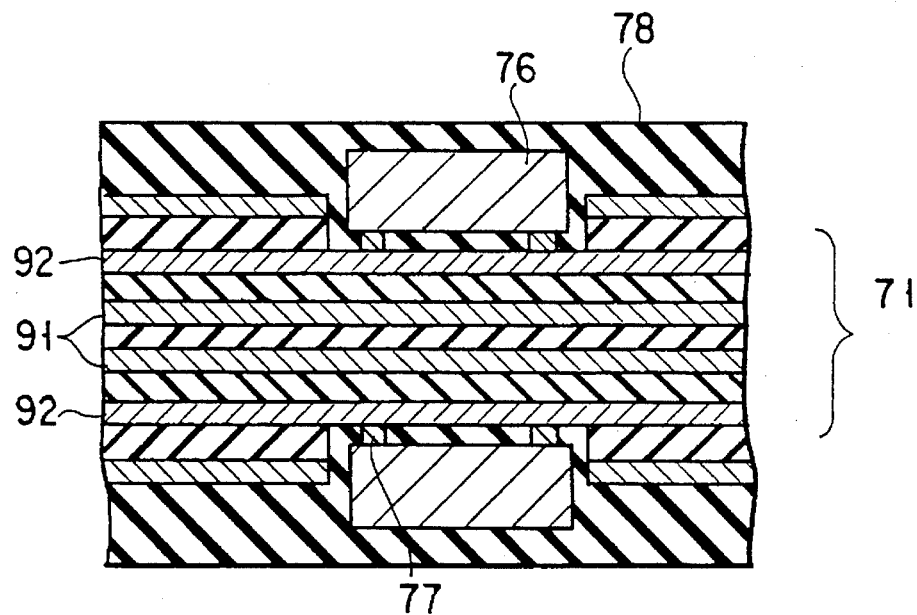

In the second embodiment, a board having four wiring layers is used as the multilevel interconnection board. However, a multilevel interconnection board 71 having six wiring layers or more can be used, as shown in FIG. 9. This case is the same as the second embodiment in the following respects. That is, connection pads are formed on inner wiring layers 91 at the central portion of the multilevel interconnection board 71, the connection pads of the inner wiring layers 91 are connected to the electrodes of the semiconductor chips 76 through bumps 77, and the two entire surfaces of the multilevel interconnection board 71 are covered with molding resin layers 78. Also, as shown in FIG. 10, connection pads may be formed on the outermost inner wiring layers 92 of a multilevel interconnection board 71, the connection pads on the inner wiring layers 92 may be connected to the electrodes of semiconductor chips 76 through bumps 77, and the two entire surfaces of the multilevel interconnection board 71 may be covered with molding resin layers 78.

Figure 11:
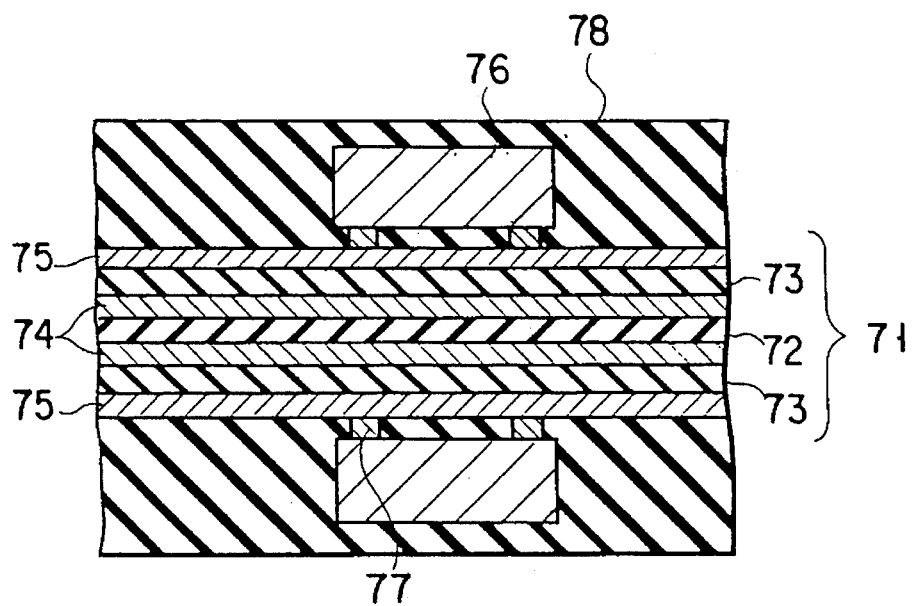

Inner wiring layers are formed to supply the power supply potential Vcc and the ground potential Vss. However, they can be formed for signal transmission. Also, as shown in FIG. 11, connection pads may be formed on outer metal wiring layers 75, and the connection pads of the outer metal wiring layers 75 may be connected to the electrodes of semiconductor chips 76 through bumps 77. In this case as well, the outer metal wiring layers 75 may be used either for supplying the power supply potential Vcc and the ground potential Vss or for signal transmission.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor module, comprising:

a first insulating layer having first and second surfaces;

a first wiring layer on the first surface of the first insulating layer;

a first semiconductor chip connected to the first wiring layer;

a second insulating layer on the first wiring layer excluding an area on which the first semiconductor chip is mounted;

a second wiring layer on the second insulating layer;

a first resin layer covering a whole surface of the second wiring layer and the first semiconductor chip;

a third wiring layer on the second surface of the first insulating layer;

a second semiconconductor chip connected to the third wiring layer;

a third insulating layer on the third wiring layer excluding an area on which the second semiconductor chip is mounted;

a fourth wiring layer on the third insulating layer; and a second resin layer covering a whole surface of the fourth wiring layer and the second semiconductor chip.

2. A semiconductor module according to claim 1, wherein a distance from a surface of the first resin layer to a surface of the second resin layer is less than 0.9 mm.

3. A semiconductor module according to claim 1, wherein the first and second semiconductor chips are memory chips.

4. A semiconductor module, comprising:

a first insulating layer having first and second surfaces;

a first wiring layer on the first surface of the first insulating layer;

a first semiconductor chip connected to the first wiring layer;

a second insulating layer on the first wiring layer excluding an area on which the first semiconductor chip is mounted;

a second wiring layer on the second insulating layer;

a third insulating layer on the second wiring layer excluding an area on which the first semiconductor chip is mounted;

a third wiring layer on the third insulating layer;

a first resin covering a whole surface of said third wiring layer and the first semiconductor chip;

a fourth wiring layer on the second surface of the first insulating layer;

a fifth wiring layer on the fourth insulating layer;

a second semiconductor chip connected to the fourth wiring layer;

a fourth insulating layer on the fourth wiring layer excluding an area on which the second semiconductor chip is mounted;

a fifth insulating layer on the fifth wiring layer excluding an area on which the second semiconductor chip is mounted;

a sixth wiring layer on the fifth insulating layer; and a second resin layer covering a whole surface of the sixth wiring layer and on the second semiconductor layer.

5. A semiconductor module, comprising:

a first insulating layer having first and second surfaces;

a first wiring layer on the first surface of the first insulating layer;

a second insulating layer on the first wiring layer;

a second wiring layer on the second insulating layer;

a first semiconductor chip connected to the second wiring layer;

a third insulating layer on the second wiring layer excluding an area on which the first semiconductor chip is mounted;

a third wiring layer on the third insulating layer;

a first resin layer covering a whole surface of the third wiring layer and the first semiconductor chip;

a fourth wiring layer on the second surface of the first insulating layer;

a fourth insulating layer on the fourth wiring layer;

a fifth wiring layer on the fourth insulating layer;

a second semiconductor chip connected to the fifth wiring a fifth insulating layer on the fifth wiring layer excluding an area on which the second semiconductor chip is mounted;

a sixth wiring layer on the fifth insulating layer; and a second resin layer covering a whole surface of the sixth wiring layer and the second semiconductor chip.

* * * * *